(12) United States Patent
Aoki

(10) Patent No.: US 7,595,505 B2
(45) Date of Patent: Sep. 29, 2009

(54) ORGANIC TRANSISTOR AND ACTIVE-MATRIX SUBSTRATE

(75) Inventor: Takashi Aoki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/132,648

(22) Filed: Jun. 4, 2008

(65) Prior Publication Data
US 2009/0032810 A1 Feb. 5, 2009

(30) Foreign Application Priority Data
Jul. 30, 2007 (JP) ............... 2007-197350

(51) Int. Cl.
*H01L 51/10* (2006.01)
(52) U.S. Cl. ............... 257/40; 257/72; 257/258; 257/642; 257/E21.006; 257/E21.007
(58) Field of Classification Search .......... 257/40, 257/72, 258, 642
See application file for complete search history.

(56) References Cited
U.S. PATENT DOCUMENTS

| 2004/0023447 A1* | 2/2004 | Hirakata et al. ............ 438/149 |
| 2004/0235227 A1* | 11/2004 | Kawase ................. 438/158 |
| 2005/0056847 A1* | 3/2005 | Nakamura et al. .......... 257/72 |
| 2005/0179365 A1 | 8/2005 | Deane et al. |
| 2007/0212807 A1* | 9/2007 | Yamada et al. ............ 438/99 |
| 2008/0129942 A1* | 6/2008 | Shin ...................... 349/139 |

FOREIGN PATENT DOCUMENTS

| JP | 2005-524224 | 8/2005 |
| JP | 2006-278984 | 10/2006 |
| JP | 2007-305802 | * 9/2007 |
| WO | WO03091795 | 11/2003 |

* cited by examiner

*Primary Examiner*—A. Sefer
(74) *Attorney, Agent, or Firm*—Harness, Dickey & Pierce, P.L.C.

(57) ABSTRACT

An organic transistor includes a gate electrode having a predetermined length, source and drain electrodes overlapping the gate electrode in plan view, a channel region formed of the organic semiconductor between the source and drain electrodes, and a functional portion disposed on a first side of the gate electrode in a length direction thereof and connected to the drain electrode through a strip-like connection wiring line. A strip-like dummy connection wiring line is connected to the drain electrode so as to extend toward a second side of the gate electrode in the length direction thereof and has a width that is less than twice the width of the connection wiring line. The connection wiring line extends to or beyond an edge of the gate electrode on the first side, and the dummy connection wiring line extends to or beyond an edge of the gate electrode on the second side.

7 Claims, 6 Drawing Sheets

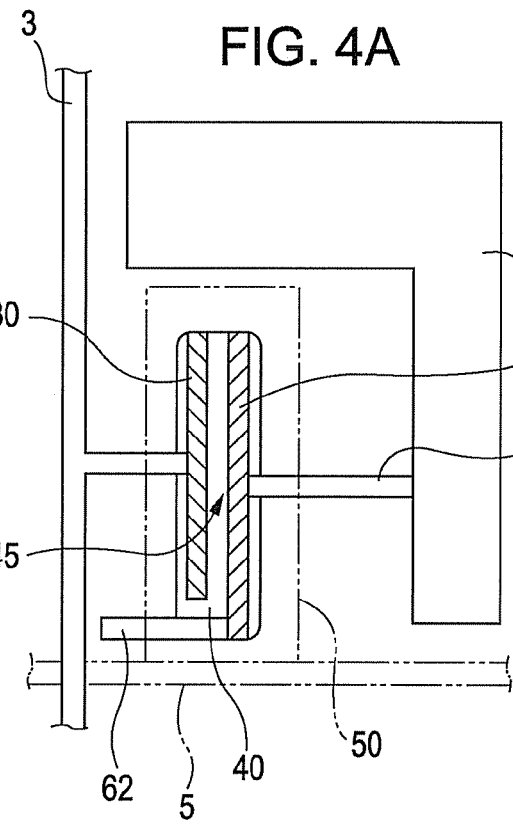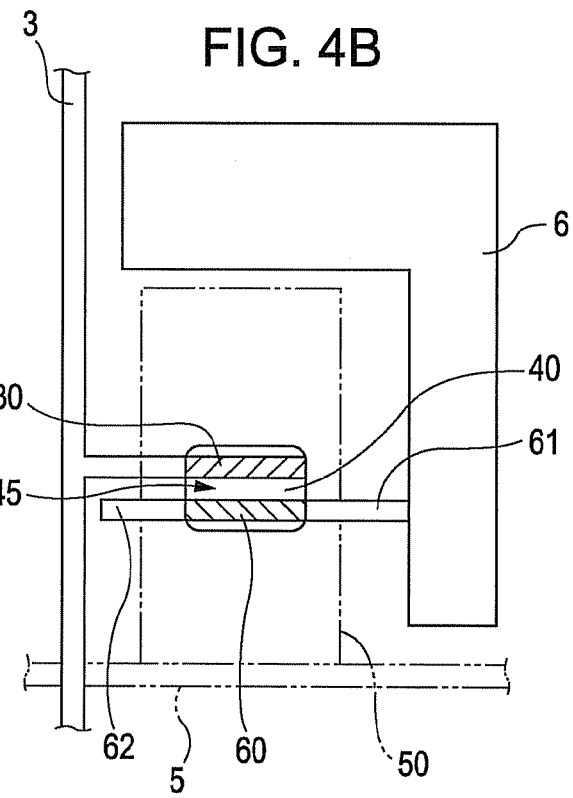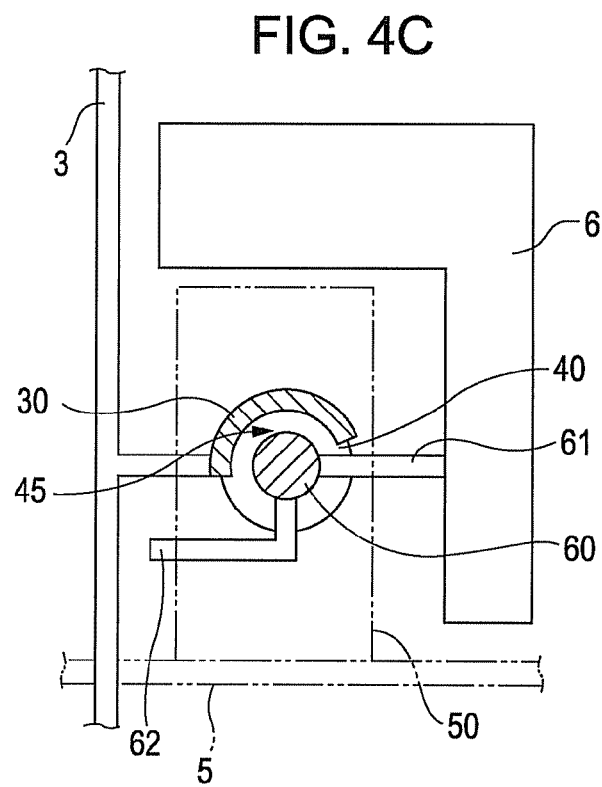

United States Patent US 7,595,505 B2

ORGANIC TRANSISTOR AND ACTIVE-MATRIX SUBSTRATE

BACKGROUND

1. Technical Field

The present invention relates to organic transistors and active-matrix substrates.

2. Related Art

Organic transistors using organic materials have recently attracted attention as an alternative to thin-film transistors using inorganic materials such as silicon. Because organic transistors can be produced by a low-temperature process, plastic substrates or films can be used to form flexible, lightweight, tough devices. In addition, organic transistors can be formed using liquid materials by a simple method such as coating or printing to form devices in a short time. This provides the great advantage of significantly reducing process costs and formation apparatus costs. Furthermore, organic transistors using organic materials can support various functions, including those that would not be feasible with inorganic materials, because the material properties of organic materials can readily be changed by, for example, modifying their molecular structures.

An organic transistor includes source and drain regions, a channel region formed of an organic semiconductor material between the source and drain regions, a gate electrode capable of applying an electric field to the channel region, and a gate insulating film between the gate electrode and the channel region. This structure allows a current to flow across the source and drain regions when an electric field is applied to the channel region.

With consideration given to processing errors such as misalignment, the gate electrode is usually formed so that it can apply an electric field over a region including at least the entire channel region and extending beyond that region. The electric field, consequently, is applied to part of or the entire source and drain regions, thus generating parasitic capacitance in the region exposed to the electric field. When the electric field applied by the gate electrode is interrupted, the parasitic capacitance is split into parasitic capacitance in the drain region and hold capacitance in an element connected to the drain region. This splitting decreases the voltage applied to the element, thus affecting the function of the element. For a display including pixel display elements connected to such drain regions, for example, its contrast decreases at pixels corresponding to pixel display elements where the voltage decrease occurs.

The magnitude of change (decrease) in the voltage applied to the elements connected to the drain regions depends on the magnitude of parasitic capacitance in the drain regions. The parasitic capacitance has variations in magnitude due to misalignment, thus causing variations in the function of the elements. Such variations in element function cause problems including degraded display performance due to variations in the degree of contrast decrease among pixels. Some methods for avoiding such problems are disclosed in, for example, JP-A-2006-278984 (Patent Document 1) and JP-T-2005-524224 (Patent Document 2). According to the method of Patent Document 1, parasitic capacitance is reduced by forming a gate insulating film that is thicker in regions other than channel regions. According to the method of Patent Document 2, periodic variations in parasitic capacitance that occur in a pixel array of a matrix display are prevented by irregularly changing the parasitic capacitance in the pixel array.

The method of Patent Document 1, however, requires a complicated process to form a gate insulating film of locally varying thickness. This may pose problems such as increased process costs and decreased yield. In addition, although this method can reduce parasitic capacitance, it cannot reduce variations in parasitic capacitance. The method of Patent Document 2, on the other hand, makes the degraded display performance of each pixel less recognizable, although this method cannot provide the effect of improving display quality because it does not improve the display performance itself.

SUMMARY

An advantage of some aspects of the invention is that it provides an organic transistor of stable quality with a reduced variation in parasitic capacitance and an active-matrix substrate including such organic transistors.

An organic transistor according to an aspect of the invention includes a gate electrode having a predetermined length, source and drain electrodes overlapping the gate electrode in plan view, an organic semiconductor portion formed of an organic material between the source and drain electrodes, a channel region provided in the organic semiconductor portion to function as a channel between the source and drain electrodes, and a functional portion disposed on a first side of the gate electrode in a length direction thereof and connected to the drain electrode through a strip-like connection wiring line. The entire drain electrode overlaps the gate electrode in plan view. The connection wiring line is connected to the drain electrode so as to extend toward the first side. A strip-like dummy connection wiring line is connected to the drain electrode so as to extend toward a second side of the gate electrode in the length direction thereof and has a width that is less than twice the width of the connection wiring line. The connection wiring line extends to or beyond an edge of the gate electrode on the first side, and the dummy connection wiring line extends to or beyond an edge of the gate electrode on the second side.

With the configuration including the dummy connection wiring line, the magnitude of change is reduced in the area of a region where the drain-side conductive portions, namely, the drain electrode, the connection wiring line, and the dummy connection wiring line, overlap the gate electrode in plan view if the gate electrode becomes misaligned from a desired position in the length direction.

For example, if the gate electrode becomes misaligned toward the first side by a certain displacement x, the area of a region where the connection wiring line overlaps the gate electrode is increased by the product of the displacement x and the width $B_1$ of the connection wiring line, namely, $x \cdot B_1$. At the same time, the area of a region where the dummy connection wiring line overlaps the gate electrode is decreased by the product of the displacement x and the width $B_2$ of the dummy connection wiring line, namely, $x \cdot B_2$. The area of a region where the drain electrode overlaps the gate electrode does not change after the misalignment because the entire drain electrode overlaps the gate electrode. Hence, the area of the region where the drain-side conductive portions overlap the gate electrode is changed by $|x \cdot B_1 - x \cdot B_2|$ after the misalignment. Because the width $B_2$ of the dummy connection wiring line is less than twice the width $B_1$ of the connection wiring line, namely, $B_2 < 2B_1$, the magnitude of change in the area of the overlapping region, $|x \cdot B_1 - x \cdot B_2|$, is less than $x \cdot B_1$, that is, the magnitude of change in the area of the overlapping region for a configuration including no dummy connection wiring line.

Similarly, the magnitude of change is reduced in the area of the region where the drain-side conductive portions overlap the gate electrode if the gate electrode becomes misaligned toward the second side by a certain displacement.

Thus, the magnitude of change is reduced in the area of the region where the drain-side conductive portions overlap the gate electrode whether the gate electrode becomes misaligned toward the first side or to the second side in the length direction. This reduction in the magnitude of change in the area of the overlapping region due to misalignment contributes to a reduction in the magnitude of change, or variation, in parasitic capacitance in the drain-side conductive portions because the parasitic capacitance is proportional to the area of the overlapping region.

When an electric field applied by the gate electrode is interrupted, the parasitic capacitance is spilt into parasitic capacitance in the drain-side conductive portions and hold capacitance on the functional portion side, that is, in an element connected to the functional portion. This splitting decreases the voltage applied to the element. The organic transistor according to this aspect, however, has a reduced variation in the parasitic capacitance in the drain-side conductive portions due to misalignment, as described above, thus having a reduced variation in the magnitude of voltage decrease due to capacitance splitting.

With the organic transistor according to this aspect, therefore, the element connected to the functional portion functions uniformly even if the gate electrode becomes misaligned in the length direction. A device including such organic transistors as switching elements, for example, provides stable quality with uniform characteristics. According to this aspect, additionally, organic transistors of uniform quality can be produced with an increased margin for misalignment. This permits the use of a simple patterning technique, thus reducing process costs, and also improves the yield of organic transistors.

The phrase "length of the gate electrode" in this invention refers to a dimension of the gate electrode in a predetermined direction that may be any direction. The predetermined direction is defined as the length direction of the gate electrode, and the positional relationship between the individual components of the organic transistor is specified with respect to this direction. The phrases "length of the gate electrode" and "length direction of the gate electrode" in this invention are merely expressions used for convenience in describing the positional relationship between the components; they do not refer to any particular length or direction.

It is preferable that the connection wiring line and the dummy connection wiring line have the same width.

In this case, the magnitude of change in the area of the region where the drain-side conductive portions overlap the gate electrode, $|x \cdot B_1 - x \cdot B_2|$, becomes zero, so that the parasitic capacitance in the drain-side conductive portions does not change after misalignment. The organic transistor can therefore achieve more uniform characteristics.

In addition, it is preferable that the source and drain electrodes have an interdigital shape. This shape includes strip-like branches arranged in parallel at regular intervals, and ends of the branches on one side are connected to a base perpendicular to the branches. If the source and drain electrodes having such a shape are disposed opposite each other such that their branches are staggered, they allow a current to flow through the channel region over a wider area than those having, for example, a rectangular shape of the same area. The source and drain electrodes can therefore allow more current to flow through the channel region than those having another shape of the same area, thus efficiently supplying a current to the channel region. In addition, this shape requires a smaller electrode area to allow a predetermined current to flow, thus reducing parasitic capacitance. The organic transistor can therefore achieve excellent quality.

In addition, the connection wiring line may be formed by photolithography and may have a width of 1 to 10 µm.

In general, fine wiring formed on a substrate may be delaminated because the adhesion between the wiring and the substrate is difficult to ensure sufficiently. In addition, patterning of such wiring requires a highly accurate technique and may result in decreased yield if its accuracy is insufficient. It is preferable, on the other hand, that the connection wiring line be formed with the smallest width allowed in a production process because the connection wiring line generates a parasitic capacitance corresponding to its area. If the connection wiring line is formed by photolithography and has a width of 1 to 10 µm, it can ensure sufficient adhesion and process accuracy. This avoids problems such as decreased yield while minimizing the parasitic capacitance. The organic transistor can therefore achieve excellent quality.

Alternatively, the connection wiring line may be formed by printing and may have a width of 10 to 100 µm. If the connection wiring line is formed by printing and has a width of 10 to 100 µm, it can ensure sufficient adhesion and process accuracy. This avoids problems such as decreased yield while minimizing the parasitic capacitance. The organic transistor can therefore achieve excellent quality.

In addition, it is preferable that the entire organic semiconductor portion overlap the gate electrode in plan view.

In general, a large leakage current flows through a region of an organic semiconductor portion where no electric field is applied by a gate electrode. If the entire organic semiconductor portion overlaps the gate electrode, it can apply an electric field to the entire organic semiconductor portion, thus suppressing the leakage current. This reduces off current in the organic transistor, which therefore consumes less power.

In addition, it is preferable that an active-matrix substrate include a plurality of organic transistors according to the above aspect of the invention. Because the organic transistors according to the above aspect have uniform quality, as described above, the active-matrix substrate including these organic transistors has smaller variations in the voltage applied to, for example, elements connected to the functional portions of the organic transistors, that is, variations in the magnitude of voltage decrease with variations in parasitic capacitance due to capacitance splitting. The elements connected to the functional portions can therefore operate without variations in function. If a display, for example, is configured by connecting the functional portions, serving as pixel electrodes, to pixel display elements, the magnitude of voltage decrease due to capacitance splitting becomes uniform among the pixel display elements. This prevents a deterioration in image quality, such as variations in the degree of contrast decrease among pixels, so that a display with high image quality can be provided.

BRIEF DESCRIPTION OF THE DRAWINGS

The invention will be described with reference to the accompanying drawings, wherein like numbers reference like elements.

FIGS. 4A to 4C are schematic plan views of modifications of the organic transistor.

DESCRIPTION OF EXEMPLARY EMBODIMENTS

An embodiment of the invention will now be described, although the technical scope of the invention is not limited to the embodiment below. In the following description, various structures are illustrated with the drawings, where the structures may be shown in different sizes or scales from actual structures to clarify features of the structures. In the embodiment below, an active-matrix substrate including organic transistors arranged in a matrix will be described as an example.

Figure 1:
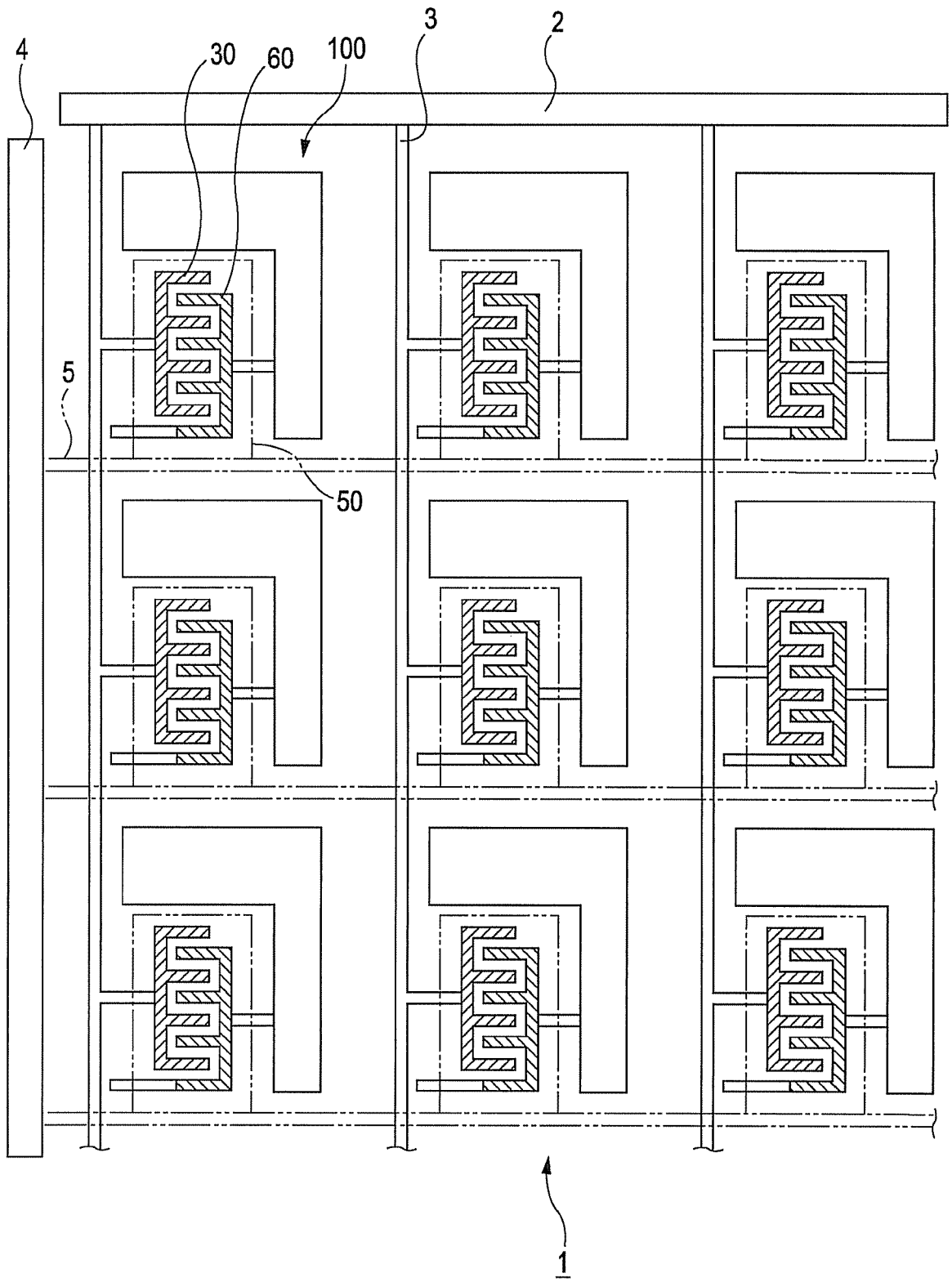
FIG. 1 is a schematic plan view of an active-matrix substrate according to an embodiment of the invention.

FIG. 1 is a schematic plan view of an active-matrix substrate 1 according to this embodiment. In FIG. 1, the active-matrix substrate 1 according to this embodiment includes organic transistors 100 arranged in a matrix. The organic transistors 100 each include a source electrode 30, a drain electrode 60, and a gate electrode 50. The source electrodes 30 in each column of the matrix are connected to one data line 3. The data lines 3 are connected to a data-line drive circuit 2 that drives the source electrodes 30 through the data lines 3. The gate electrodes 50 in each row of the matrix are connected to one scanning line 5. The scanning lines 5 are connected to a scanning-line drive circuit 4 that drives the gate electrodes 50 through the scanning lines 5.

Figure 2A:
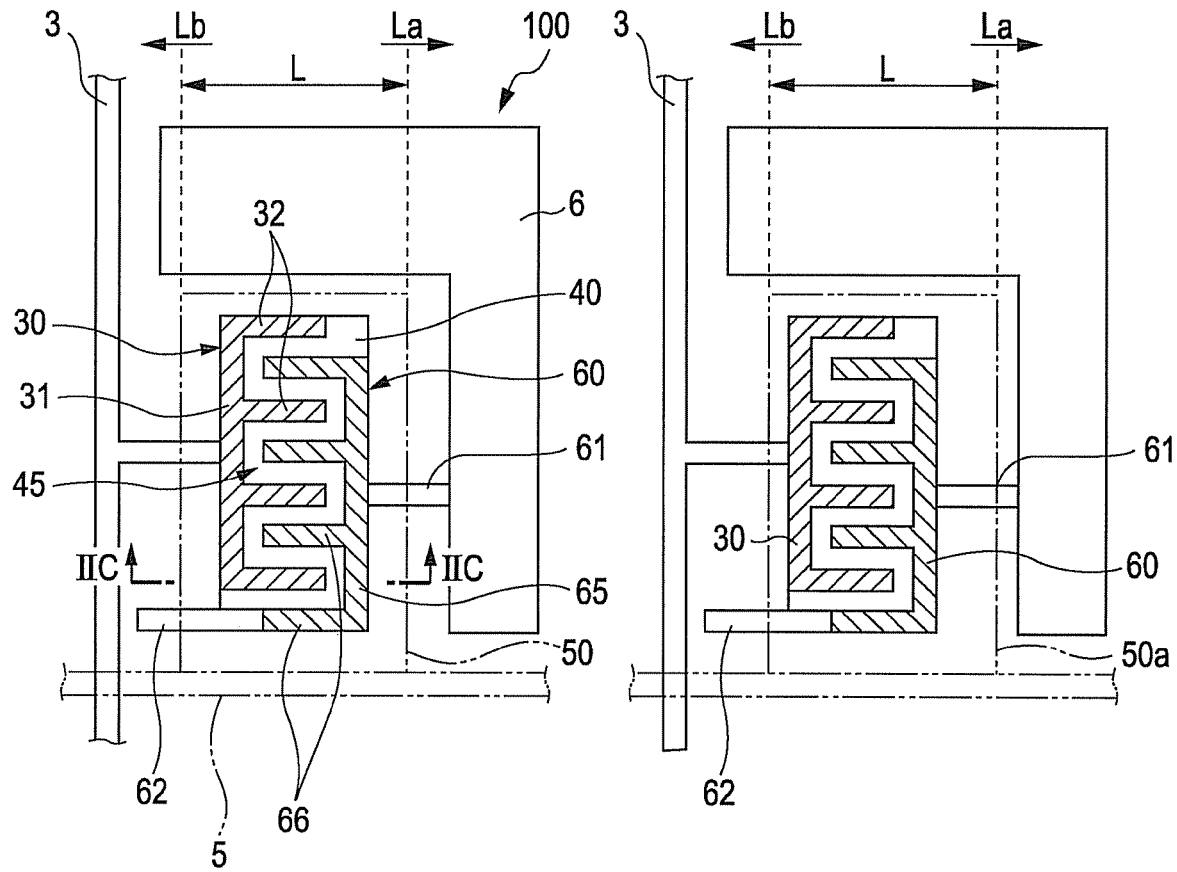
FIGS. 2A to 2C are schematic plan views of an organic transistor according to the embodiment of the invention.
Figure 2B:
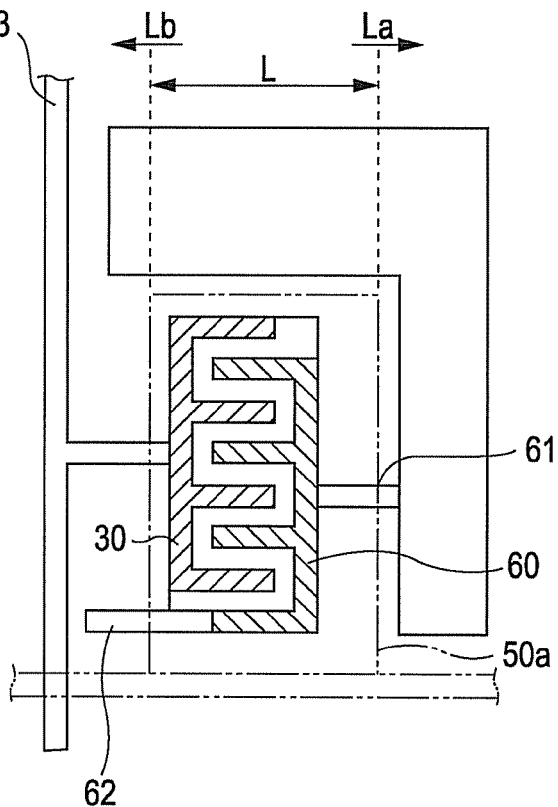
Figure 2C:
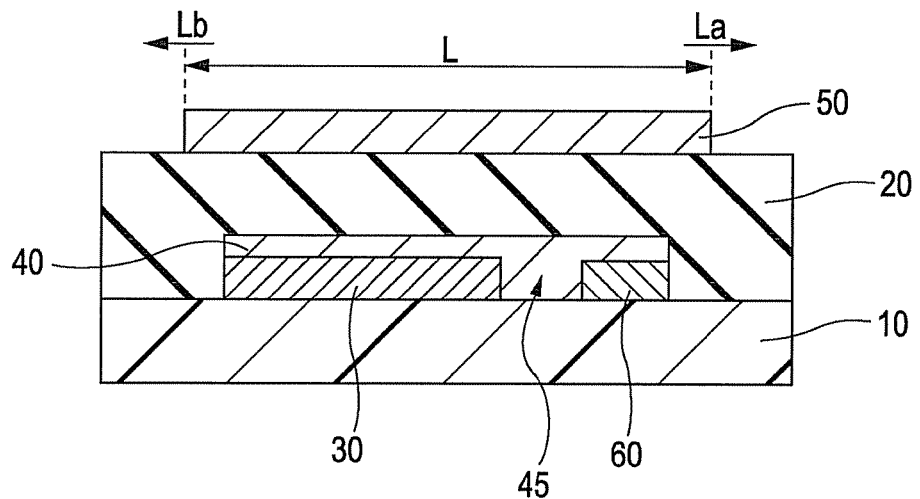

FIGS. 2A and 2B are enlarged plan views of a main part of the active-matrix substrate 1. FIG. 2C is a sectional view taken along line IIC-IIC of FIG. 2A. FIG. 2A shows an example in which the gate electrode 50 is formed at a predetermined position. FIG. 2B shows an example in which the gate electrode 50 is misaligned from the predetermined position to one side La of the gate electrode 50 in a length direction thereof.

In FIG. 2A, the gate electrode 50, which is a rectangle in this embodiment, has a short side of a predetermined length L, and a direction parallel to the short side is defined as the length direction of the gate electrode 50.

The source electrode 30 and the drain electrode 60 overlap the gate electrode 50 in plan view; in particular, the entire source electrode 30 overlaps the gate electrode 50. The source electrode 30 and the drain electrode 60 have an interdigital shape in this embodiment. Specifically, the source electrode 30 includes branches 32 extending toward the side La in the length direction and a base 31 perpendicular to the branches 32. The branches 32 are arranged in parallel at regular intervals, with their ends on the other side Lb in the length direction connected to the base 31. Similarly, the drain electrode 60 includes a base 65 and branches 66. The source electrode 30 and the drain electrode 60 are arranged with the bases 31 and 65 facing each other such that the branches 32 and 66 are staggered.

The source electrode 30 and the drain electrode 60 are separated by an organic semiconductor portion 40 formed of an organic material. The organic semiconductor portion 40 includes a channel region 45 functioning as a channel between the source electrode 30 and the drain electrode 60. In this embodiment, the entire organic semiconductor portion 40 overlaps the gate electrode 50 in plan view. A voltage (electric field) applied to the channel region 45 by the gate electrode 50 allows a current to flow through the channel region 45, which then functions as a channel.

A functional portion 6 is disposed on the side La of the gate electrode 50 in the length direction thereof. The functional portion 6 is electrically connected to the drain electrode 60 through a connection wiring line 61 to output electrical signals from the drain electrode 60. For a device including the active-matrix substrate 1, the functional portion 6 can function as, for example, a connection portion between the active-matrix substrate 1 and an element that supports the function of the device. For a display (device) including the active-matrix substrate 1, for example, the functional portion 6 can be used as a pixel electrode to function as a connection portion between the active-matrix substrate 1 and a pixel display element, such as a liquid crystal element, an organic electroluminescent (EL) element, or an electrophoretic element, and also as part of the pixel display element (electrode).

In addition to the connection wiring line 61 extending in the side La, the drain electrode 60 includes a dummy connection wiring line 62 extending in the other side Lb. In this embodiment, the connection wiring line 61 is connected to the base 65 of the drain electrode 60, whereas the dummy connection wiring line 62 is connected to the end on the side Lb of the branch 66 disposed at one end of the base 65 of the drain electrode 60. The connection wiring line 61 and the dummy connection wiring line 62 have the same width in a direction perpendicular to the length direction. The connection wiring line 61 and the dummy connection wiring line 62 can function as part of the drain electrode 60 and as a connection portion between the drain electrode 60 and the functional portion 6.

In FIG. 2C, the organic transistor 100 according to this embodiment has a top-gate, bottom-contact structure. Specifically, the organic semiconductor portion 40 is disposed on a substrate 10, and the source electrode 30 and the drain electrode 60 are disposed inside the organic semiconductor portion 40. The channel region 45 is defined between the source electrode 30 and the drain electrode 60 in the organic semiconductor portion 40. A gate insulating film 20 is disposed over the organic semiconductor portion 40. The gate electrode 50 is disposed on the gate insulating film 20 so as to cover at least the entire organic semiconductor portion 40.

The substrate 10 used may be any substrate, for example, a glass substrate, a metal substrate such as an aluminum substrate or an stainless steel substrate, or a plastic substrate. Of these, a plastic substrate is preferred because it is less expensive, lightweight, and flexible. The plastic substrate used may be formed of either a thermoplastic resin or a thermosetting resin. Examples of such resins include polyolefins such as polyethylene, polypropylene, ethylene-propylene copolymer, and ethylene-vinyl acetate copolymer (EVA); cyclic polyolefins; modified polyolefins; poly(vinyl chloride); poly(vinylidene chloride); polystyrene; polyamide; polyimide; polyamideimide; polycarbonate; poly-(4-methylpentene-1); ionomers; acrylic resin; poly(methyl methacrylate); acrylonitrile-styrene copolymer (AS); butadiene-styrene copolymer; ethylene-vinyl alcohol copolymer (EVOH); polyesters such as poly(ethylene terephthalate), poly(butylene terephthalate), poly(ethylene naphthalate), and poly(cyclohexylenedimethylene terephthalate) (PCT); polyether; poly(ether ketone); poly(ether ether ketone); poly(ether imide); polyacetal; poly(phenylene oxide); modified poly(phenylene oxide); polyarylate; aromatic polyesters (liquid crystal polymers); fluororesins such as polytetrafluoroethylene and poly(vinylidene fluoride); various thermoplastic elastomers such as styrene elastomer, polyolefin elastomer, poly(vinyl chloride) elastomer, polyurethane elastomer, fluororubber, and chlorinated polyethylene elastomer; epoxy resin; phenolic resin; urea resin; melamine resin; unsaturated polyester; silicone resin;

polyurethane; and copolymers, blends, and polymer alloys thereof. These polymers can be used alone or as a laminate of two or more. The substrate 10 used in this embodiment is a plastic substrate formed of polyimide.

Examples of conductive materials used for the scanning lines 5, the data lines 3, the functional portions 6, the gate electrodes 50, the source electrodes 30, the drain electrodes 60, the connection wiring lines 61, and the dummy connection wiring lines 62 include metals such as chromium, aluminum, tantalum, molybdenum, niobium, copper, silver, gold, platinum, palladium, indium, nickel, neodymium, and alloys thereof; conductive oxides such as $InO_2$, $SnO_2$, and ITO; conductive polymers such as polyaniline, polypyrrole, polythiophene, and polyacetylene and those doped with acids such as hydrochloric acid, sulfuric acid, and sulfonic acids, Lewis acids such as $PF_6$, $AsF_5$, and $FeCl_3$, halogens such as iodine, and metals such as sodium and potassium; and conductive composite materials with dispersed carbon black or metal particles.

The above conductive portions can be formed by, for example, patterning a conductive film formed of a conductive material as listed above by photolithography and etching, or by forming a metal-film pattern on a substrate by vapor deposition through a metal through-mask having openings of predetermined shapes rather than etching.

The conductive material used may also be a polymer mixture containing conductive particles such as metal microparticles or graphite particles. With this solution, the conductive portions can readily be formed at low cost by solution patterning such as ink jetting.

In this embodiment, the data lines 3, the functional portions 6, and the connection wiring lines 61 are formed by coating with an aqueous dispersion of silver microparticles, whereas the source electrodes 30, the drain electrodes 60, and the dummy connection wiring lines 62 are formed by coating with a toluene dispersion of gold microparticles. The scanning lines 5 and the gate electrodes 50 are formed by vapor deposition with gold through a metal through-mask.

Examples of the material of the organic semiconductor portion 40 include polymer organic semiconductor materials such as poly(3-alkylthiophene), poly(3-hexylthiophene) (P3HT), poly(3-octylthiophene), poly(2,5-thienylene vinylene) (PTV), poly(p-phenylene vinylene) (PPV), poly(9, 9-dioctylfluorene) (PFO), poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorene-triallylamine copolymer, triallylamine-based polymer, and fluorene-bithiophene copolymers such as poly(9,9-dioctylfluorene-co-dithiophene) (F8T2). Other examples include low-molecular-weight organic semiconductor materials such as C60 compounds and substituted derivatives thereof; metal phthalocyanines and substituted derivatives thereof; acenes such as anthracene, tetracene, pentacene, and hexacene; and α-oligothiophenes such as quaterthiophene (4T), sexithiophene (6T), and octathiophene. These materials can be used alone or as a mixture of two or more.

To form the organic semiconductor portions 40, a film of an organic semiconductor material can be formed by a common film-formation method such as vapor deposition (e.g., CVD), casting, dip coating, the Langmuir-Blodgett technique, spraying, ink jetting, or silkscreening.

In this embodiment, the organic semiconductor portions 40 are formed by coating with poly(3-hexylthiophene) (P3HT).

The gate insulating films 20 can be formed of either an organic material or an inorganic material. Examples of inorganic materials include metal oxides such as silicon oxide, silicon nitride, aluminum oxide, and tantalum oxide; and metal compound oxides such as barium strontium titanate and lead zirconium titanate. Typical examples of organic materials include polyester, polycarbonate, poly(vinyl alcohol), polyacetal, poly(p-xylylene), polyarylate, polyamide, polyamideimide, polyolefin, poly(ether imide), poly(phenylene ether), poly(phenylene sulfide), polyethersulfone, poly(ether ketone), polyphthalamide, poly(ether nitrile), polybenzimidazole, polycarbodiimide, polysiloxane, poly(methyl methacrylate), polymethacrylamide, nitrile rubber, acrylic rubber, poly(ethylene tetrafluoride), epoxy resin, urethane resin, phenolic resin, melamine resin, urea resin, polybutene, polypentene, polybutadiene, butyl rubber, polystyrene, and copolymers thereof.

In this embodiment, the gate insulating film 20 is formed by coating with the same material as the substrate 10, namely, polyimide, to enhance adhesion to the substrate 10. Because polyimide is an organic material, it provides good adhesion to the organic semiconductor portion 40, which is formed of an organic material as well.

In the active-matrix substrate 1 thus configured, the data-line drive circuit 2 can transmit electrical signals to the source electrodes 30 through the data lines 3 at predetermined timings, whereas the scanning-line drive circuit 4 can apply a voltage to the gate electrodes 50 through the scanning lines 5 at predetermined timings.

When the voltage is applied to the gate electrode 50, it applies an electric field to the channel region 45 between the source electrode 30 and the drain electrode 60, so that the channel region 45 is switched on, functioning as a channel. The electrical signals are transmitted through the channel to the drain electrode 60 and then through the connection wiring line 61 to the functional portion 6. The electrical signals, such as in the form of current or voltage, transmitted to the functional portion 6 drive the element connected to the functional portion 6.

The electric field applied through the gate insulating film 20 by the gate electrode 50 induces parasitic capacitance in conductive portions exposed to the electric field, that is, conductive portions overlapping the gate electrode 50 in plan view, including the entire source electrode 30 and drain electrode 60 and part of the connection wiring line 61, the dummy connection wiring line 62, and the data line 3.

When the electric field applied by the gate electrode 50 is interrupted, the parasitic capacitance is spilt into parasitic capacitance on the drain electrode 60 side and hold capacitance in the element connected to the functional portion 6 through the connection wiring line 61. This splitting decreases the voltage applied to the element in response to the parasitic capacitance on the drain electrode 60 side.

Organic transistors of the related art have variations in parasitic capacitance on the drain electrode side due to misalignment of, for example, gate electrodes. This results in variations in the magnitude of voltage decrease among elements and therefore variations in element function.

The organic transistor 100 according to this embodiment, in contrast, prevents variations in element function because the parasitic capacitance on the drain electrode 60 side remains constant irrespective of misalignment.

Specifically, the parasitic capacitance on the drain electrode 60 side is proportional to the area of the region where the drain-side conductive portions, including the drain electrode 60, the connection wiring line 61, and the dummy connection wiring line 62, overlap the gate electrode 50. With the connection wiring line 61 and the dummy connection wiring line 62, the area of the region where the drain-side conductive portions overlap the gate electrode 50 does not change even if the gate electrode 50 becomes misaligned in the length direction.

In FIG. 2B, a gate electrode 50*a* misaligned toward the side La in the length direction by a certain displacement overlaps the connection wiring line 61 over a larger region (area) than one that is not misaligned. At the same time, the gate electrode 50*a* overlaps the dummy connection wiring line 62 over a smaller region (area) than one that is not misaligned. The increase in the area of the region where the gate electrode 50*a* overlaps the connection wiring line 61 is expressed as the product of the width of the connection wiring line 61 and the displacement, whereas the decrease in the area of the region where the gate electrode 50*a* overlaps the dummy connection wiring line 62 is expressed as the product of the width of the dummy connection wiring line 62 and the displacement. The area of the region where the gate electrode 50*a* overlaps the drain electrode 60 does not change because the gate electrode 50*a* overlaps the entire drain electrode 60.

Hence, the misalignment increases the area of the region where the gate electrode 50*a* overlaps the drain-side conductive portions by the product of the width of the connection wiring line 61 and the displacement and decreases the area by the product of the width of the dummy connection wiring line 62 and the displacement. Because the connection wiring line 61 and the dummy connection wiring line 62 have the same width, the increase in the area of the overlapping region is equal in magnitude to the decrease in the area of the overlapping region irrespective of the displacement of the gate electrode 50*a* due to misalignment, so that the area remains constant.

If the gate electrode 50 becomes misaligned toward the other side Lb in the length direction by a certain displacement, the area of the overlapping region decreases over the connection wiring line 61 and increases over the dummy connection wiring line 62. Because the decrease and the increase are equal in magnitude, the area of the overlapping region remains constant, as in the case of the misalignment toward the side La.

The allowable displacement of misalignment toward the side La is equal to the length of a portion of the connection wiring line 61 extending toward the side La beyond the gate electrode 50, whereas the allowable displacement of misalignment toward the other side La is equal to the length of a portion of the dummy connection wiring line 62 extending toward the side Lb beyond the gate electrode 50. Because the displacement due to misalignment is usually random, a margin for misalignment can be increased if the length of the portion of the connection wiring line 61 extending toward the side La beyond the gate electrode 50 is equal to the length of the portion of the dummy connection wiring line 62 extending toward the side Lb beyond the gate electrode 50.

If the gate electrode 50 becomes misaligned in a direction perpendicular to the length direction, the area of the overlapping region does not change because the region where the gate electrode 50 overlaps the drain-side conductive portions does not change.

In the organic transistor 100 according to this embodiment, as described above, the magnitude of change is reduced in the area of the region where the drain-side conductive portions overlap the gate electrode 50 if the gate electrode 50 becomes misaligned. This reduces a variation in parasitic capacitance in the drain-side conductive portions. When the electric field applied by the gate electrode 50 is interrupted, therefore, the voltage applied to the element connected to the functional portion 6 is uniformly decreased, so that the element can function with uniform characteristics.

The active-matrix substrate 1 according to this embodiment includes the above organic transistors 100, so that the elements connected to the organic transistors 100 can function with uniform characteristics. If a display, for example, includes the active-matrix substrate 1 and pixel display elements connected to the organic transistors 100, they cause no display defects, such as variations in the degree of contrast decrease among pixels, because the voltage applied to the pixel display elements is uniformly decreased upon interruption of the electric field applied by the gate electrodes 50. Thus, a display with excellent display quality can be provided.

If the connection wiring line 61 and the dummy connection wiring line 62 have the same width, as in this embodiment, the organic transistor 100 can achieve more uniform quality.

If the source electrode 30 and the drain electrode 60 have an interdigital shape, they allow more current to flow through the channel region 45 than those having another shape of the same area. In addition, this shape requires a smaller electrode area to allow a predetermined current to flow, thus reducing parasitic capacitance. The organic transistor 100 can therefore achieve excellent quality.

If the entire organic semiconductor portion 40 overlaps the gate electrode 50 in plan view, they cause less leakage current, so that the organic transistor 100 consumes less power.

As in this embodiment, the dummy connection wiring line 62 may be used as part of the drain electrode 60. In addition, like the connection wiring line 61, the dummy connection wiring line 62 may be used as a connection portion between the drain electrode 60 and the functional portion 6 by electrically connecting the portion of the dummy connection wiring line 62 extending toward the side Lb beyond the gate electrode 50 to the functional portion 6.

Organic transistors are broadly divided into four types of structures. The organic transistor 100 according to this embodiment has a top-gate, bottom-contact structure, although any of the four structures may be employed. Examples of the three structures other than a top-gate, bottom-contact structure, used in this embodiment, will now be described.

Figure 3A:
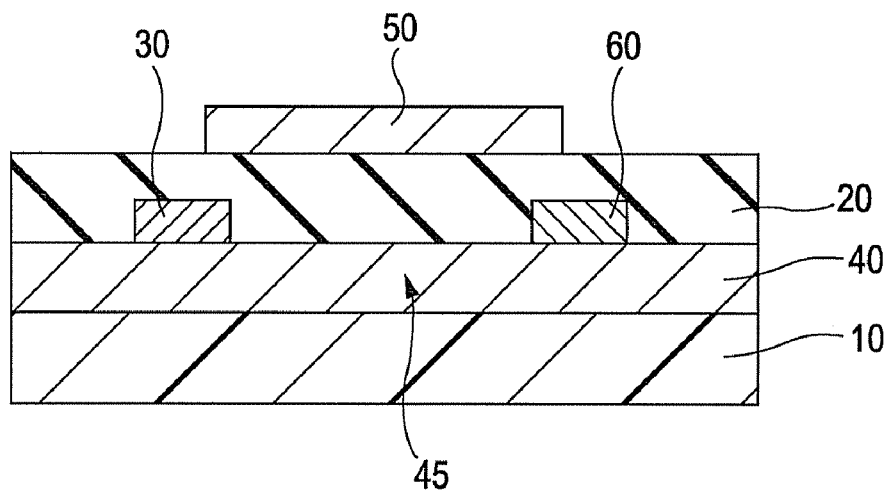
FIGS. 3A to 3C are side sectional views of examples of structures of organic transistors.
Figure 3B:
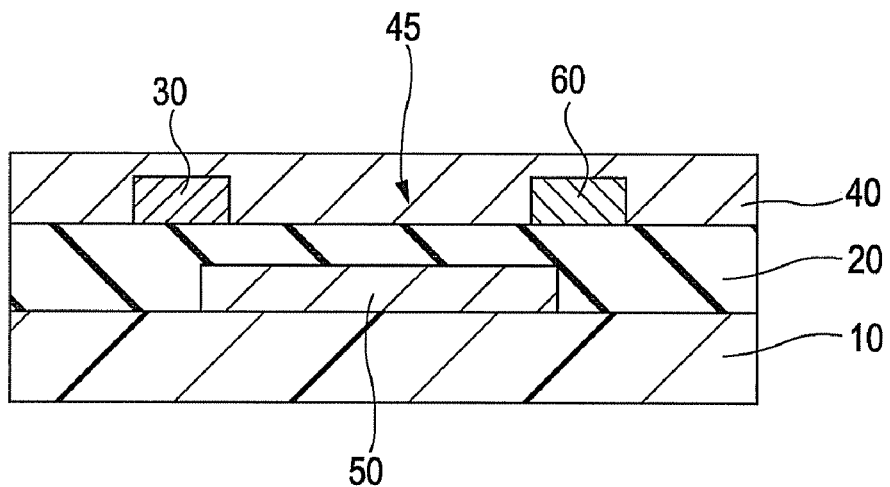
Figure 3C:
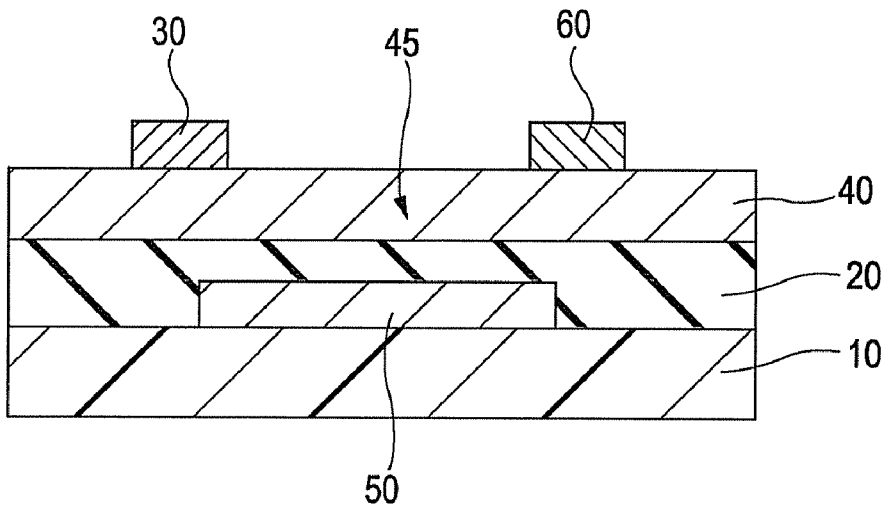

FIGS. 3A to 3C are side sectional views of typical examples of organic transistors. The organic transistors shown in FIGS. 3A to 3C each include an organic semiconductor portion 40 formed of an organic semiconductor material on a substrate 10, a source electrode 30 and a drain electrode 60 in or on the organic semiconductor portion 40, a channel region 45 between the source electrode 30 and the drain electrode 60 in the organic semiconductor portion 40, and a gate electrode 50 overlapping the channel region 45 in plan view.

The organic transistor shown in FIG. 3A has a top-gate, top-contact structure in which the gate electrode 50 is disposed on the side of the organic semiconductor portion 40 facing away from the substrate 10 (on the top side) and the source electrode 30 and the drain electrode 60 are disposed in contact with the organic semiconductor portion 40 on the side of the organic semiconductor portion 40 facing away the substrate 10 (on the top side).

The organic transistor shown in FIG. 3B has a bottom-gate, bottom-contact structure in which the gate electrode 50 is disposed on the side of the organic semiconductor portion 40 facing the substrate 10 (on the bottom side) and the source electrode 30 and the drain electrode 60 are disposed in the organic semiconductor portion 40 on the side of the organic semiconductor portion 40 facing the substrate 10 (on the bottom side).

The organic transistor shown in FIG. 3C has a bottom-gate, top-contact structure in which the gate electrode 50 is disposed on the side of the organic semiconductor portion 40 facing the substrate 10 (on the bottom side) and the source electrode 30 and the drain electrode 60 are disposed in contact with the organic semiconductor portion 40 on the side of the organic semiconductor portion 40 facing away from the substrate 10 (on the top side).

Modifications

The technical scope of the invention is not limited to the above embodiment, and various modifications are permitted. Some modifications will now be described with reference to the drawings.

FIGS. 4A to 4C are plan views of modifications of the organic transistor 100 in which the source electrode 30 and the drain electrode 60 are provided in different shapes and arrangements. FIG. 4A is an example in which a strip-like source electrode 30 and a strip-like drain electrode 60 are disposed parallel to a direction perpendicular to the length direction of the gate electrode 50. FIG. 4B is an example in which a strip-like source electrode 30 and a strip-like drain electrode 60 are disposed parallel to the length direction of the gate electrode 50. FIG. 3C is an example in which a circular drain electrode 60 and an arc-shaped source electrode 30 extending along part of the circumference of the drain electrode 60 are provided. For such organic transistors, in which the source electrodes 30 and the drain electrodes 60 are provided in different shapes and arrangements, the configuration including the connection wiring line 61 and the dummy connection wiring line 62 can prevent variations in parasitic capacitance due to misalignment.

In addition to the above embodiment and modifications, for example, the gate electrode 50 may be of a shape other than a rectangle, for example, a circle, an ellipse, a triangle, a polygon with five or more sides, or a combination thereof. For any shape, the configuration including the connection wiring line 61 and the dummy connection wiring line 62 can provide the advantages described above.

EXAMPLE

Next, an example of application of the active-matrix substrate 1 according to the above embodiment to electrophoretic electronic paper will now be described along with an example of a method for producing the electronic paper.

FIGS. 5A and 5B and FIGS. 6A and 6B are sectional views illustrating the method for producing the electrophoretic electronic paper of this example, in which a main part of the electronic paper, namely, the organic transistors 100 on the active-matrix substrate 1, is shown in enlarged view.

First, a polyimide substrate 10 with a thickness of 200 μm was subjected to surface degreasing treatment by ultrasonic cleaning in isopropyl alcohol for five minutes, followed by drying.

Figure 5A:
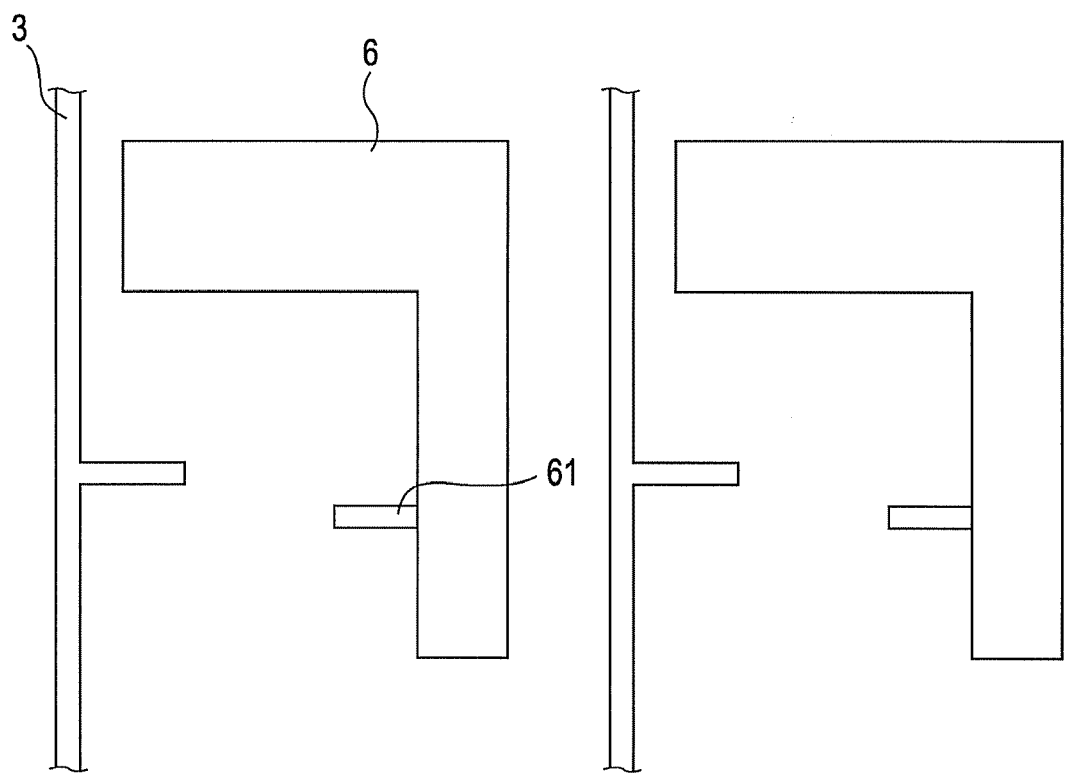
FIGS. 5A and 5B are plan views illustrating steps of an example of a method for producing an active-matrix substrate.

Referring to FIG. 5A, the data lines 3, the functional portions (pixel electrodes) 6, and the connection wiring lines 61 were formed by coating with an aqueous dispersion of silver microparticles. Specifically, the substrate 10 (see FIG. 2C) was dipped in a toluene solution of octadecyltrichlorosilane for ten minutes to impart slight water repellency to the substrate 10, thereby adjusting the contact angle of the aqueous dispersion to the substrate 10 to 600. The substrate 10 was then selectively coated with the aqueous dispersion using an ink-jet coating apparatus. The substrate 10 coated with the aqueous dispersion was dried on a hot plate at 80° C. for ten minutes to remove water (dispersing medium) from the aqueous dispersion, thus simultaneously forming the data lines 3, the functional portions 6, and the connection wiring lines 61. The connection wiring lines 61 had a width of 50 μm.

Figure 5B:
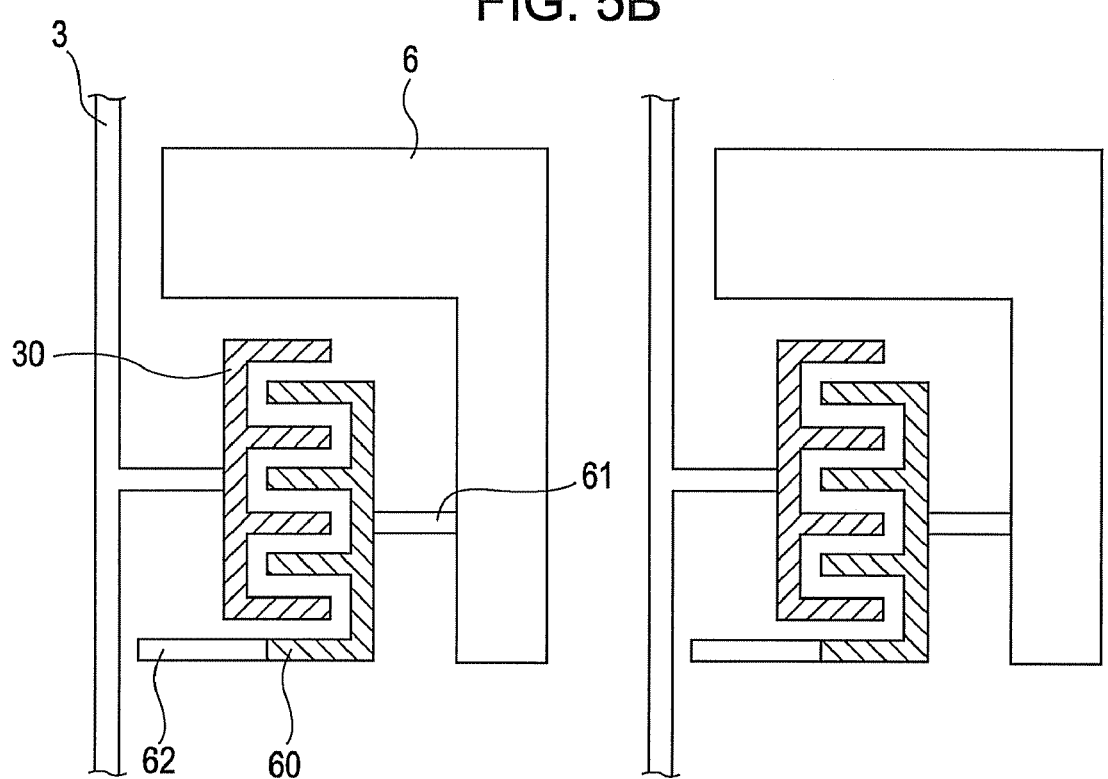

Referring to FIG. 5B, the source electrodes 30, the drain electrodes 60, and the dummy connection wiring lines 62 were formed. The material used was gold to provide a good electrical connection between the electrodes 30 and 60 and the organic semiconductor portions 40 to be formed later. Specifically, the substrate 10 was pattern-coated with a toluene dispersion of gold microparticles by ink jetting. The substrate 10 coated with the toluene dispersion was fired at 120° C. for 30 minutes to remove toluene (dispersing medium) from the toluene dispersion, thus simultaneously forming the source electrodes 30, the drain electrodes 60, and the dummy connection wiring lines 62. The dummy connection wiring lines 62, as well as the connection wiring lines 61, had a width of 50 μm. The conductive portions, including the data lines 3, the functional portions (pixel electrodes) 6, the source electrodes 30, the drain electrodes 60, the connection wiring lines 61, and the dummy connection wiring lines 62, may be formed simultaneously using the same material or separately using materials selected for their respective applications.

The surface of the substrate 10 on which the source electrodes 30, the drain electrodes 60, and the dummy connection wiring lines 62 were formed was cleaned by surface treatment using oxygen plasma. The surface treatment was performed at a power of 200 W, an oxygen flow rate of 100 sccm, and an argon flow rate of 100 sccm for a treatment time of five minutes using the plasma treatment apparatus PX1000 manufactured by SAMCO Inc.

Figure 6A:
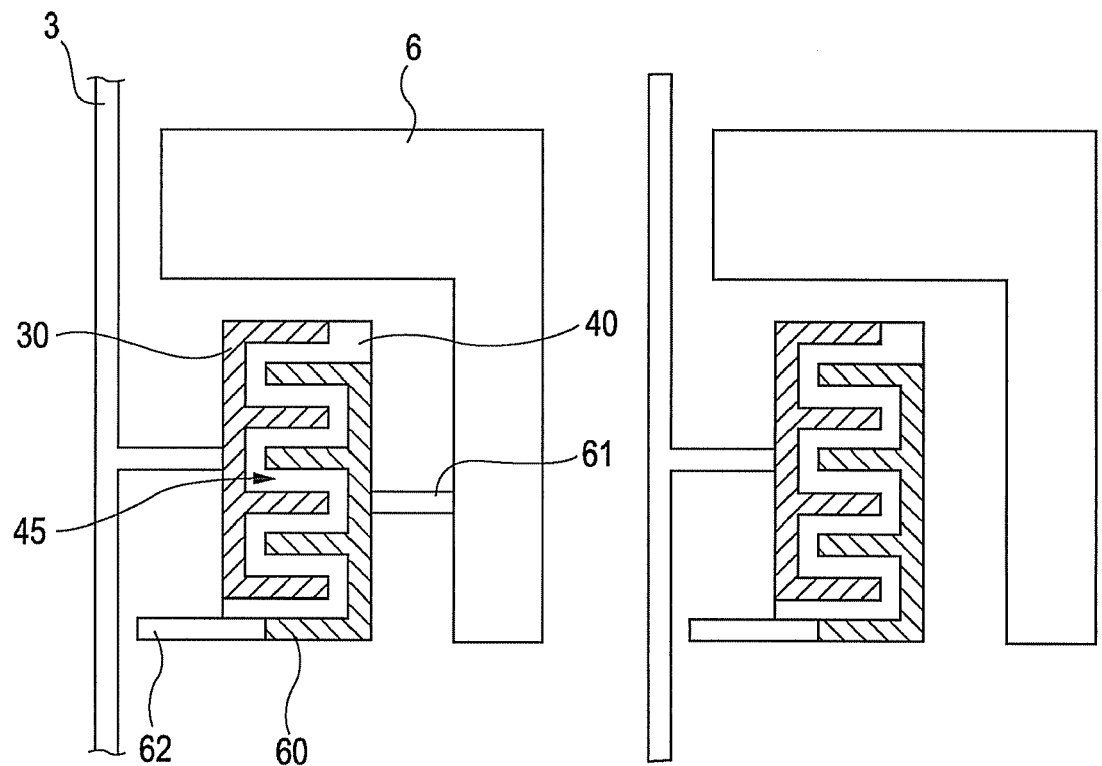
FIGS. 6A and 6B are plan views illustrating subsequent steps of the method for producing an active-matrix substrate.

A coating solution was then prepared by dissolving poly (3-hexylthiophene) (P3HT) in xylene as an organic semiconductor material to a concentration of 0.5% by weight. Referring to FIG. 6A, the substrate 10 was coated with the solution using an ink-jet coating apparatus in regions where the channel regions 45 were to be formed between the source electrodes 30 and the drain electrodes 60. The substrate 10 was dried in a drying oven preheated to 100° C. for ten minutes to remove the solvent, namely, xylene, thus forming the organic semiconductor portions 40.

The substrate 10 may be subjected to surface treatment before the formation of the organic semiconductor portions 40 so that they can be formed in an excellent condition. Examples of this treatment include surface treatment using a surface modifier such as hexamethyldisilazane, cyclohexene, or octadecyltrichlorosilane; organic cleaning treatment using, for example, acetone or isopropyl alcohol; surface treatment using an acid such as hydrochloric acid, sulfuric acid, or acetic acid or an alkali such as sodium hydroxide, potassium hydroxide, calcium hydroxide, or ammonia; ultraviolet ozone treatment; fluorination treatment; plasma treatment using, for example, oxygen or argon; and Langmuir-Blodgett film formation. These treatments may be used alone or in combination of two or more. The surface treatment may be uniformly applied to the entire substrate 10 or, for example, only to the regions where the organic semiconductor portions 40 are to be formed or not to be formed.

The substrate 10 on which the organic semiconductor portions 40 were formed was coated with a polyimide solution by spin coating and was dried on a hot plate preheated to 100° C. for ten minutes to remove the solvent from the polyimide solution, thus uniformly forming the gate insulating film 20 (see FIG. 2C) on the entire substrate 10. The gate insulating film 20 had a thickness of 500 nm.

Figure 6B:
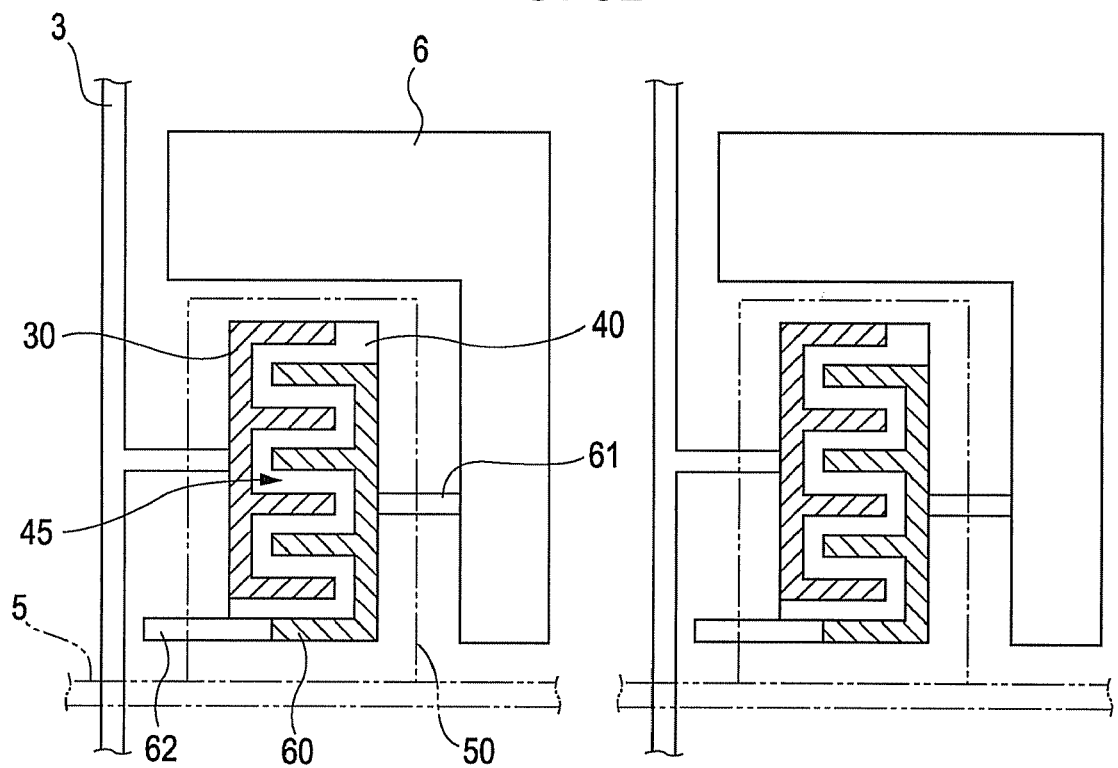

The substrate 10 on which the gate insulating film 20 was formed was placed in a resistance-heating vapor deposition apparatus. A deposition chamber was evacuated to a vacuum of $10^{-4}$ Pa before a gold film was formed to a thickness of 100 nm. A gold vapor released upward by heating was deposited on the substrate 10 through an opening formed in a metal through-mask, thus simultaneously forming the scanning lines 5 and the gate electrodes 50, as shown in FIG. 6B.

A protective layer (not shown) for protecting, for example, the gate electrodes 50 was formed over the scanning lines 5 and the gate electrodes 50 on the substrate 10. An electrophoretic sheet (not shown) including an electrophoretic material layer containing an electrophoretic material and a common electrode was laminated on the protective layer. The scanning-line drive circuit 4 (see FIG. 1) for driving the gate electrodes 50 through the scanning lines 5 and the data-line drive circuit 2 (see FIG. 1) for controlling electrical signals transmitted to the source electrodes 30 through the data lines 3 were attached to the substrate 10. Thus, the electrophoretic electronic paper including the active-matrix substrate 1 according to the above embodiment was completed.

Typical electrophoretic electronic paper can hold a displayed image after interruption of an electric field applied by gate electrodes by maintaining the voltage between a common electrode and pixel electrodes. The electrophoretic electronic paper produced in this example could hold a displayed image without variations in the degree of contrast decrease among pixels after interruption of an electric field applied by the gate electrodes 50, thus providing excellent display quality. This demonstrates that the elements functioned with uniform characteristics. Thus, the effectiveness of the invention was confirmed.

As in this example, organic transistors of excellent quality can be produced by a liquid-phase process using liquid materials at a lower cost than thin-film transistors using inorganic materials. One of the reasons for the low production costs is that a material can be selectively applied by, for example, printing or droplet ejection; it does not require a patterning process such as photolithography. In general, however, the accuracy with which a material is applied by printing or droplet ejection is lower than the accuracy of photolithography, and organic transistors formed by printing or droplet ejection tend to be misaligned. With this invention, organic transistors of excellent quality can be produced at low cost while preventing variations in element function due to misalignment.

What is claimed is:

1. An organic transistor comprising:
a gate electrode having a predetermined length;
source and drain electrodes overlapping the gate electrode in plan view;
an organic semiconductor portion formed of an organic material between the source and drain electrodes;
a channel region provided in the organic semiconductor portion to function as a channel between the source and drain electrodes; and
a functional portion disposed on a first side of the gate electrode in a length direction thereof and connected to the drain electrode through a strip-like connection wiring line;
wherein the entire drain electrode overlaps the gate electrode in plan view, the connection wiring line being connected to the drain electrode so as to extend toward the first side, a strip-like dummy connection wiring line being connected to the drain electrode so as to extend toward a second side of the gate electrode in the length direction thereof and having a width that is less than twice the width of the connection wiring line; and
wherein the connection wiring line extends to or beyond an edge of the gate electrode on the first side and the dummy connection wiring line extends to or beyond an edge of the gate electrode on the second side.

2. The organic transistor according to claim 1, wherein the connection wiring line and the dummy connection wiring line have the same width.

3. The organic transistor according to claim 1, wherein the source and drain electrodes have an interdigital shape.

4. The organic transistor according to claim 1, wherein the connection wiring line is formed by photolithography and has a width of 1 to 10 μm.

5. The organic transistor according to claim 1, wherein the connection wiring line is formed by printing and has a width of 10 to 100 μm.

6. The organic transistor according to claim 1, wherein the entire organic semiconductor portion overlaps the gate electrode in plan view.

7. An active-matrix substrate comprising a plurality of organic transistors according to claim 1.

* * * * *